United States Patent
Wang (10) Patent No.: US 8,862,954 B1
(45) Date of Patent: Oct. 14, 2014

(54) INTEGRATED CIRCUIT SCAN TESTING WITH STOP-CLOCK AND AUTO-STEP FEATURES

(75) Inventor: Yongjiang Wang, Austin, TX (US)

(73) Assignee: Marvell International Ltd., Hamilton (BM)

( * ) Notice: Subject to any disclaimer, the term of this patent is extended or adjusted under 35 U.S.C. 154(b) by 414 days.

(21) Appl. No.: 13/039,359

(22) Filed: Mar. 3, 2011

Related U.S. Application Data (60) Provisional application No. 61/312,133, filed on Mar. 9, 2010, provisional application No. 61/312,883, filed on Mar. 11, 2010, provisional application No. 61/318,564, filed on Mar. 29, 2010.

(51) Int. Cl.
*G01R 31/28* (2006.01)

(52) U.S. Cl.
USPC .......................................................... 714/731

(58) Field of Classification Search
USPC .......................................................... 714/731
See application file for complete search history.

(56) References Cited

U.S. PATENT DOCUMENTS

| | | | |
|---|---|---|---|
| 6,442,723 B1 * | 8/2002 | Koprowski et al. | 714/732 |
| 7,743,300 B1 | 6/2010 | Rosen | |
| 2002/0136064 A1 * | 9/2002 | Yoshiyama | 365/189.05 |
| 2002/0184560 A1 * | 12/2002 | Wang et al. | 714/25 |
| 2005/0138509 A1 * | 6/2005 | Kiryu et al. | 714/726 |
| 2005/0149892 A1 * | 7/2005 | Yee | 716/4 |
| 2006/0156119 A1 * | 7/2006 | Watanabe | 714/726 |
| 2008/0092002 A1 * | 4/2008 | Shimooka | 714/731 |
| 2009/0070646 A1 * | 3/2009 | Wang et al. | 714/728 |
| 2010/0107024 A1 * | 4/2010 | Tokunaga | 714/729 |
| 2010/0332928 A1 * | 12/2010 | Li et al. | 714/731 |
| 2012/0221910 A1 * | 8/2012 | Grise et al. | 714/733 |
| 2012/0331362 A1 * | 12/2012 | Tekumalla | 714/731 |

* cited by examiner

*Primary Examiner* — Ajay Bhatia
*Assistant Examiner* — Thien D Nguyen (57) ABSTRACT

Apparatus having corresponding methods and computer-readable media comprise a function module to operate according to a clock signal; a clock control module to provide a clock gate signal; and a clock gate module to provide the clock signal to the function module only until the clock control module provides the clock gate signal; wherein the function module includes a plurality of storage elements, wherein the storage elements form a scan chain in response to a mode signal; and wherein the scan chain is configured to shift data stored therein out of the scan chain.

24 Claims, 6 Drawing Sheets

INTEGRATED CIRCUIT SCAN TESTING WITH STOP-CLOCK AND AUTO-STEP FEATURES

CROSS-REFERENCE TO RELATED APPLICATIONS

This disclosure claims the benefit of U.S. Provisional Patent Application Ser. No. 61/312,133, entitled "A Clock Manipulate Method for Speed Path Debug of Application Processor," filed on Mar. 9, 2010; U.S. Provisional Patent Application Ser. No. 61/312,883, entitled "Full Chip Scan Using Stop Clock As Post Silicon Debug Probing Mechanism For Application Processor," filed on Mar. 11, 2010; and U.S. Provisional Patent Application Ser. No. 61/318,564, entitled "Full Chip Scan as a Debug Tool in FPGA Validation for Application Processor," filed on Mar. 29, 2010, the disclosures thereof incorporated by reference herein in their entirety.

FIELD

The present invention relates generally to testing integrated circuits. More particularly, the present invention relates to scan testing of integrated circuits.

BACKGROUND

Modern integrated circuits generally comprise a large number of circuit elements. It is desirable to test these circuit elements in order to ensure the proper operation of the integrated circuit. However, the number of test points (that is, locations where signals can be measured) is limited by the number of terminals of the integrated circuit, which are vastly outnumbered by the number of circuit elements to be tested.

Consequently, designers of modern integrated circuits often employ test techniques referred to herein as "scan testing." According to scan testing, a mode signal can be asserted that causes predetermined storage elements within an integrated circuit to connect serially to form a scan chain. Data can be shifted into, and out of, the scan chain. Before a test begins, a test vector can be shifted into the scan chain to provide a known starting point for the test. At the end of the test, data can be shifted out of the scan chain for analysis. During the test, the mode signal is negated, thereby breaking the scan chain, so that the integrated circuit can be tested in its nominal configuration. The clock signal is then toggled slowly to simulate nominal operation.

However, it is desirable to test integrated circuits with the clock at full speed, rather than at reduced speed, in order to identify problems that only appear during full-speed operation.

SUMMARY

In general, in one aspect, an embodiment features an apparatus comprising a function module to operate according to a clock signal; a clock control module to provide a clock gate signal; and a clock gate module to provide the clock signal to the function module only until the clock control module provides the clock gate signal; wherein the function module includes a plurality of storage elements, wherein the storage elements form a scan chain in response to a mode signal; and wherein the scan chain is configured to shift data stored therein out of the scan chain.

Embodiments of the apparatus can include one or more of the following features. In some embodiments, the clock control module provides the clock gate signal responsive to one or more monitored signals. Some embodiments comprise a clock module to provide the clock signal. In some embodiments, the clock control module comprises: a cycle register to store an offset integer N; a clock counter to count cycles of the clock signal subsequent to a trigger signal; and a comparator to provide the clock gate signal responsive to the clock counter counting N cycles of the system clock. Some embodiments comprise a trigger module to provide the trigger signal responsive to the one or more monitored signals. Some embodiments comprise an auto-step module to increment offset integer N in the cycle register subsequent to the data stored in the scan chain being shifted out of the scan chain. In some embodiments, the clock gate module provides the clock signal to the function module, subsequent to the auto-step module incrementing offset integer N, until the clock control module provides the clock gate signal; the storage elements form a scan chain in response to the mode signal; and data stored in the scan chain is shifted out of the scan chain. Some embodiments comprise an integrated circuit comprising the apparatus. Some embodiments comprise a field-programmable gate array comprising the apparatus. Some embodiments comprise a mode module to provide the mode signal; and a test data module to capture the data stored in the scan chain.

In general, in one aspect, an embodiment features a method for testing an integrated circuit, wherein the integrated circuit includes a clock module to provide a clock signal and a function module to operate according to the clock signal, the method comprising providing the clock signal to the function module only until a clock gate signal is provided, wherein the function module includes a plurality of storage elements; providing a mode signal subsequent to provision of the clock gate signal, wherein the storage elements form a scan chain in response to the mode signal; and capturing data stored in the scan chain subsequent to provision of the mode signal.

Embodiments of the method can include one or more of the following features. Some embodiments comprise providing the clock gate signal responsive to one or more monitored signals. Some embodiments comprise providing a trigger signal responsive to the one or more monitored signals; and providing the clock gate signal N cycles of the clock signal subsequent to provision of the trigger signal. Some embodiments comprise incrementing N subsequent to capturing the data stored in the scan chain. Some embodiments comprise providing the clock signal to the function module, subsequent to incrementing N, only until the clock gate signal is provided; providing the mode signal subsequent to provision of the clock gate signal, wherein the storage elements form a scan chain in response to the mode signal; and capturing data stored in the scan chain subsequent to provision of the mode signal.

In general, in one aspect, an embodiment features computer-readable media embodying instructions executable by a computer to perform a method for testing an integrated circuit, wherein the integrated circuit includes a clock module to provide a clock signal and a function module to operate according to the clock signal, the method comprising providing the clock signal to the function module only until a clock gate signal is provided, wherein the function module includes a plurality of storage elements; providing a mode signal subsequent to provision of the clock gate signal, wherein the storage elements form a scan chain in response to the mode signal; and capturing data stored in the scan chain subsequent to provision of the mode signal.

Embodiments of the computer-readable media can include one or more of the following features. In some embodiments, the method further comprises: providing the clock gate signal responsive to one or more monitored signals. In some embodiments, the method further comprises: providing a trigger signal responsive to the one or more monitored signals; and providing the clock gate signal N cycles of the clock signal subsequent to provision of the trigger signal. In some embodiments, the method further comprises: incrementing N subsequent to capturing the data stored in the scan chain. In some embodiments, the method further comprises: providing the clock signal to the function module, subsequent to incrementing N, only until the clock gate signal is provided; providing the mode signal subsequent to provision of the clock gate signal, wherein the storage elements form a scan chain in response to the mode signal; and capturing data stored in the scan chain subsequent to provision of the mode signal.

The details of one or more implementations are set forth in the accompanying drawings and the description below. Other features will be apparent from the description and drawings, and from the claims.

The leading digit(s) of each reference numeral used in this specification indicates the number of the drawing in which the reference numeral first appears.

DETAILED DESCRIPTION

Embodiments of the present disclosure provide integrated circuit scan testing with a stop-clock feature. That is, the internal function clock of the integrated circuit can be stopped at a predetermined time, upon the occurrence of one or more predetermined conditions, and the like. This stop-clock feature allows an integrated circuit to be operated at full speed until the clock is stopped, at which time a scan chain can be formed to extract data from the integrated circuit for analysis.

Some embodiments of the present disclosure also provide an auto-step feature. This auto-step feature allows the stop-clock feature to stop the function clock at each of a plurality of consecutive clock cycles to create a time sequence of analysis data. According to the auto-step feature, the stop-clock feature is used to stop the function clock N cycles after a predetermined time, or after the occurrence of one or more predetermined conditions, where N is a non-negative integer. After the scan data is extracted, the auto-step feature increments N and then employs the stop-clock feature again, and extracts the resulting data. This process can be repeated as many times as desired to create a time sequence of test data of any length.

The stop-clock and auto-step features can be implemented in integrated circuits in silicon for post-silicon testing, as in field-programmable gate arrays (FPGA) for FPGA validation, or the like. Post-silicon validation is a common and critical step in verifying a design. Post-silicon embodiments permit post-silicon validation using the internal function clock. Test data can therefore be referenced to the function clock, rather than to an external scan clock.

In conventional FPGA validation, an FPGA chip is programmed to represent the design. Then tests are run on the FPGA platform at frequencies that are generally much slower than those to be used in the final product. However, to probe the internal design nodes, it is necessary to make the nodes available for probing. According to conventional techniques, probe nodes must be added to the design and connected to FPGA input/output (I/O) terminals. The effort of connecting internal nodes to IO terminals is very time-consuming. In addition, due to the limitation on IO terminal count, many iterations are required to observe all of the desired nodes. That is, the observation must be reduced to fit into the FPGA platform. For large numbers of probe nodes, time-domain multiplexing schemes can be used, but such schemes add complexity and require more resources and time to debug.

According to one embodiment disclosed herein, scan test features are incorporated in an FPGA implementation. The scan insertion can be done at register transfer level (RTL), by a post-synthesis process, or the like. Almost every register node can be included in the scan chain. To read out internal signals, it is not necessary to re-synthesize the design to bring out signals to IO terminals. Instead scan testing techniques are used to shift out the contents of the nodes in the scan chain. This technique eliminates the iterative and time-consuming aspects of conventional FPGA validation, while reducing time to market.

Figure 1:
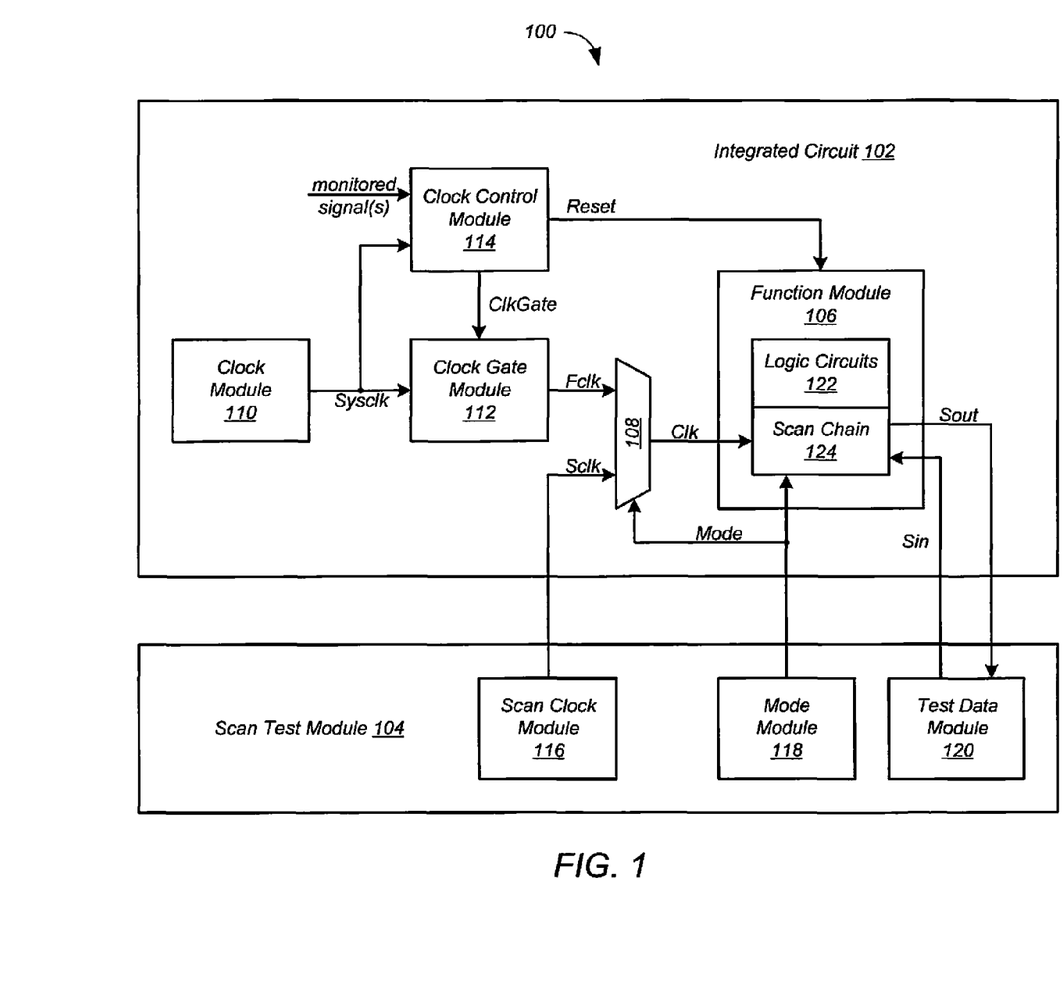
FIG. 1 shows elements of an integrated circuit scan test system according to one embodiment.

FIG. 1 shows elements of an integrated circuit scan test system 100 according to one embodiment. Although in the described embodiments the elements of scan test system 100 are presented in one arrangement, other embodiments may feature other arrangements. For example, elements of scan test system 100 can be implemented in hardware, software, or combinations thereof.

Referring to FIG. 1, scan test system 100 includes an integrated circuit 102 and a scan test module 104 for performing scan tests on integrated circuit 102. Integrated circuit 102 can be implemented in silicon, as a field-programmable gate array (FPGA), or the like. Integrated circuit 102 includes a function module 106 to be scan tested. Function module 106 operates according to a clock signal Clk, and includes logic circuits 122 and a plurality of storage elements that form a scan chain 124 in response to a Mode signal.

Integrated circuit 102 also includes a multiplexer 108 that provides either a function clock signal Fclk or a scan clock signal Sclk as clock signal Clk in accordance with the Mode signal. Integrated circuit 102 also includes a clock module 110 that provides a system clock signal Sysclk and a clock gate module 112 that provides system clock signal Sysclk as function clock signal Fclk based on a clock gate signal Clk-Gate, which is provided by a clock control module 114 in accordance with one or more monitored signals. Scan test module 104 includes a scan clock module 116 to provide scan clock Sclk, a mode module 118 to provide the Mode signal, and a test data module 120 to capture data Sout from scan chain 124. In some embodiments, test data module 120 also provides test vectors Sin to scan chain 124 to provide starting points for scan tests.

Figure 2:
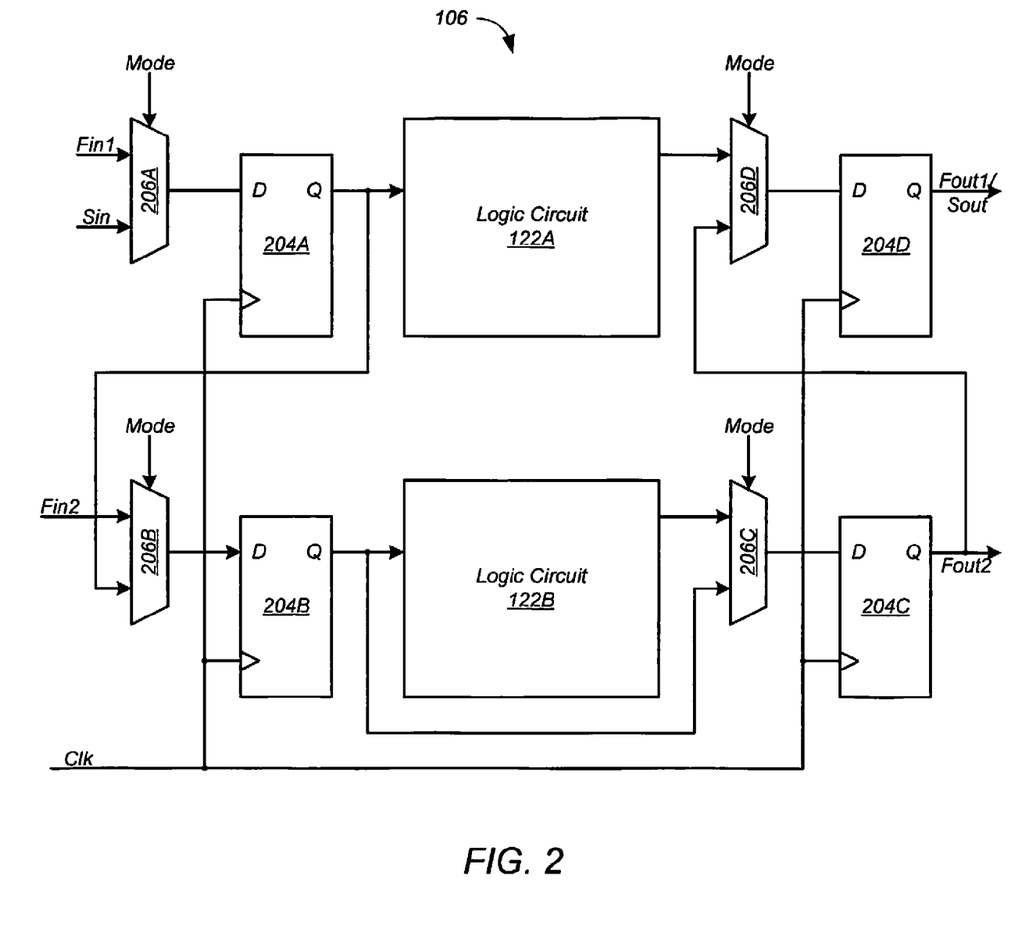
FIG. 2 shows elements of the function module of FIG. 1 according to one embodiment.

FIG. 2 shows elements of function module 106 of FIG. 1 according to one embodiment. Although in the described embodiments the elements of function module 106 are presented in one arrangement, other embodiments may feature other arrangements. For example, elements of function module 106 can be implemented in hardware, software, or combinations thereof.

Referring to FIG. 2, function module 106 includes two logic circuits 122A and 122B, four flip-flops 204A-204D, and four multiplexers 206A-206D. As shown in FIG. 2, multiplexers 206 are controlled by the Mode signal. During scan testing, the Mode signal is first negated, allowing integrated circuit 102 to operate nominally. In nominal operation, multiplexer 108 (FIG. 1) provides function clock signal Fclk as clock signal Clk. Multiplexer 206A passes a function input Fin1 to flip-flop 204A, which passes the function input to logic circuit 122A under the control of function clock Fclk. Similarly, multiplexer 206B passes a function input Fin2 to flip-flop 204B, which passes the function input to logic circuit 122B under the control of function clock Fclk. Multiplexer 206D passes a function output Fout1 to flip-flop 204D, which passes the function output under the control of function clock Fclk. Similarly, multiplexer 206C passes a function output Fout2 to flip-flop 204C, which passes the function output under the control of function clock Fclk.

As part of scan testing, flip-flops 204 of function module 106 interconnect in series to form scan chain 124 in response to the Mode signal. In particular, multiplexer 206A passes scan input Sin to flip-flop 204A, multiplexer 206B connects the output of flip-flop 204A to the input of flip-flop 204B, multiplexer 206C connects the output of flip-flop 204B to the input of flip-flop 204C, and multiplexer 206D connects the output of flip-flop 204C to the input of flip-flop 204D, which provides scan output Sout. In addition, multiplexer 108 provides scan clock Sclk as clock Clk. Scan clock module toggles scan clock Sclk to shift data through scan chain 124.

Figure 3:
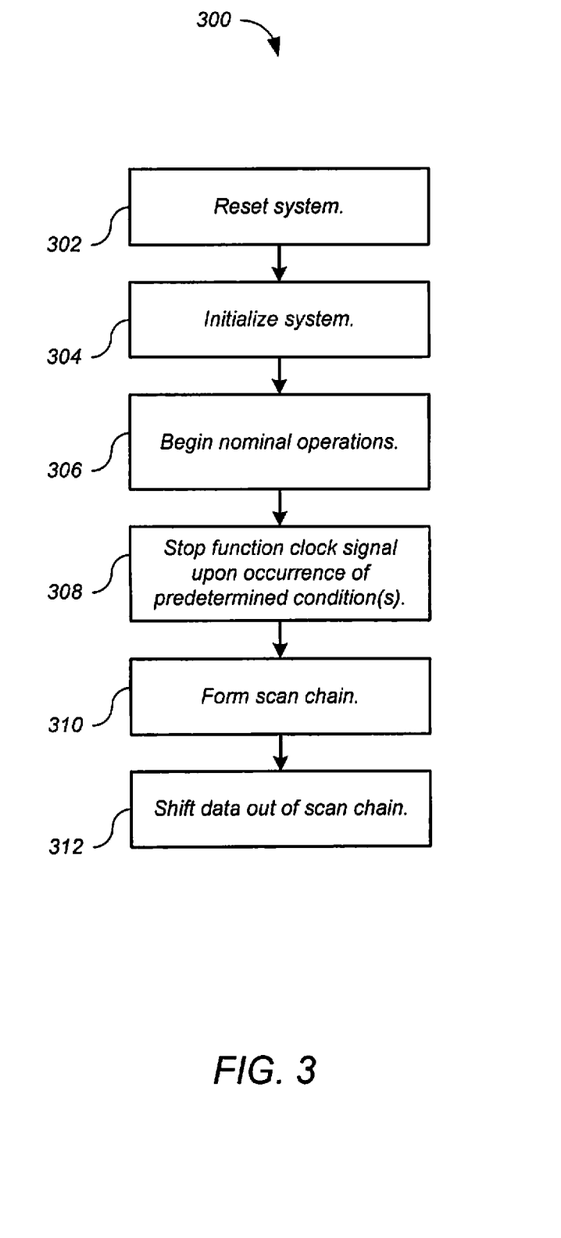
FIG. 3 shows a process for the integrated circuit scan test system of FIG. 1 according to one embodiment.

FIG. 3 shows a process 300 for integrated circuit scan test system 100 of FIG. 1 according to one embodiment. Although in the described embodiments the elements of process 300 are presented in one arrangement, other embodiments may feature other arrangements. For example, in various embodiments, some or all of the steps of process 300 can be executed in a different order, concurrently, and the like.

Referring to FIG. 3, at 302 integrated circuit scan test system 100 is reset. At 304, integrated circuit scan test system 100 is initialized. In particular, clock control module 114 is programmed to assert clock gate signal ClkGate upon the occurrence of one or more predetermined conditions, for example, when one or more monitored signals assume predetermined values.

At 306, function module 106 begins nominal operations at full clock speed. In particular, clock module 110 generates system clock signal Sysclk, and clock gate module 112 passes system clock signal Sysclk as function clock signal Fclk. During nominal operation, clock control module 114 monitors one or more signals, which are referred to herein as "monitored signals." The monitored signals can include signals generated internally by integrated circuit 102 such as interrupts and special test register outputs, signals provided by devices external to integrated circuit 102, or both.

At 308, upon the occurrence of one or more predetermined conditions, clock gate module 112 stops function clock signal Fclk. In particular, when the one or more monitored signals assume predetermined values, clock control module 114 asserts clock gate signal ClkGate. In response, clock gate module 112 ceases to pass system clock signal Sysclk, thereby stopping function clock signal Fclk.

Next, the test data is captured from function module 106 for analysis. At 310 scan test module 104 forms scan chain 124. At 312, scan test module 104 shifts the data out of scan chain 124. In particular, scan clock module 116 toggles scan clock signal Sclk, which shifts test data Sout from scan chain 124 into test data module 120. At this point the test data is ready for analysis in test data module 120.

Figure 4:
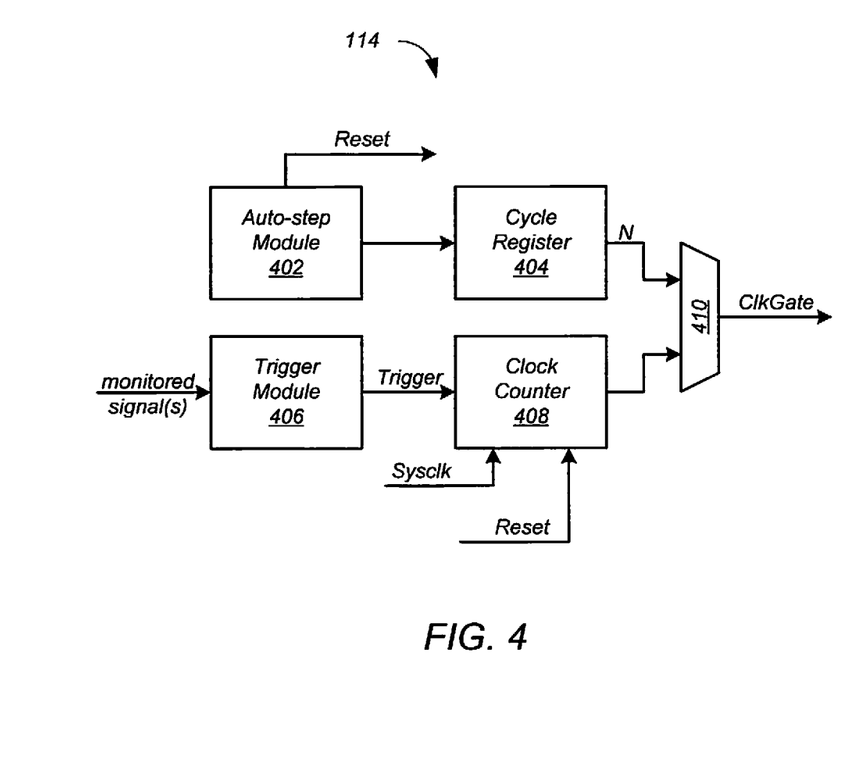
FIG. 4 shows elements of the clock control module 114 of FIG. 1 according to an embodiment having a delay stop-clock feature.

As described above, function clock Fclk can be stopped automatically upon the occurrence of one or more predetermined conditions. Some embodiments provide a delay stop-clock feature, where function clock Fclk can be stopped automatically after the occurrence of one or more predetermined conditions by a predetermined number of cycles N. FIG. 4 shows elements of clock control module 114 of FIG. 1 according to one such embodiment. Although in the described embodiments the elements of clock control module 114 are presented in one arrangement, other embodiments may feature other arrangements. For example, elements of clock control module 114 can be implemented in hardware, software, or combinations thereof.

Referring to FIG. 4, clock control module 114 includes an auto-step module 402, a cycle register 404, a trigger module 406, a clock counter 408, and a comparator 410. According to the delay stop-clock feature, cycle register 404 is loaded with a non-negative offset integer N, and trigger module 406 monitors one or more monitored signals. When the monitored signals assume predetermined values, trigger module 406 asserts a trigger signal, which causes clock counter 408 to begin counting cycles of system clock signal Sysclk. After N cycles, comparator 410 asserts clock gate signal ClkGate. In response, clock gate module 112 stops function clock signal Fclk.

Figure 5:
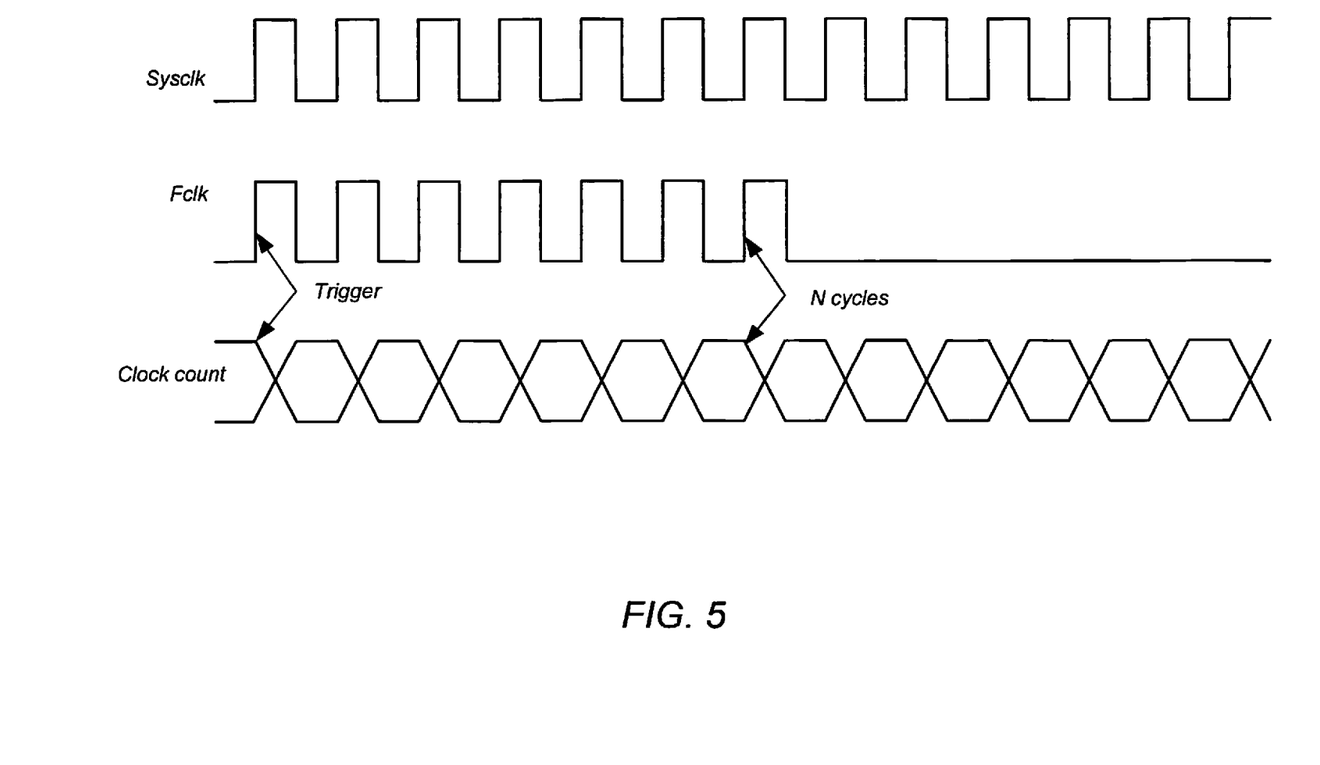
FIG. 5 is a timing diagram illustrating an operation of the clock control module of FIG. 4 according to one embodiment.

FIG. 5 is a timing diagram illustrating an operation of clock control module 114 of FIG. 4 according to one embodiment. Referring to FIG. 5, clock gate module 112 passes system clock signal Sysclk until N=7 cycles following assertion of the Trigger signal. At that point, clock gate module 112 stops function clock Fclk. Then the test data can be shifted out of scan chain 124 for analysis.

Some embodiments include an auto-step feature. According to the auto-step feature, after function clock Fclk is stopped, and the test data is extracted from scan chain 124, auto-step module 402 increments the value of N in cycle register 404, resets function module 106 by asserting a Reset signal, and repeats the scan test. In this manner, test data for successive cycles of function clock signal Fclk can be obtained automatically, thereby forming a time series of test data for analysis.

Figure 6:
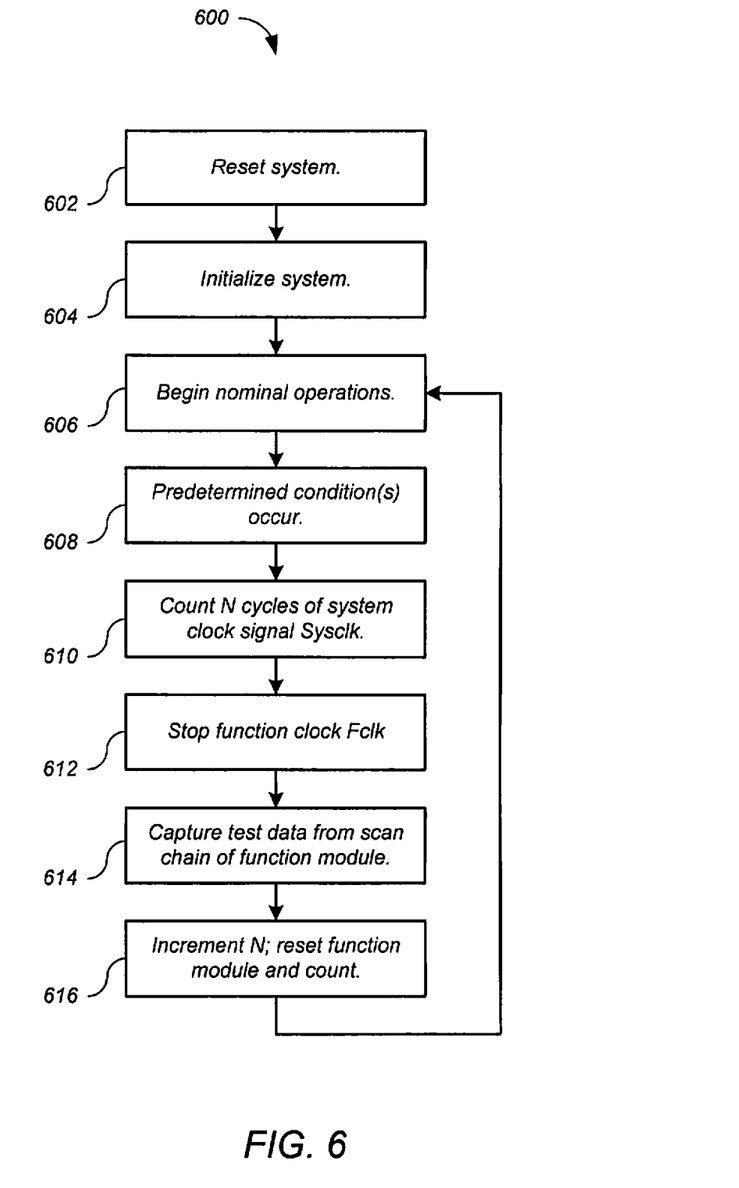
FIG. 6 shows an auto-step process for the integrated circuit scan test system of FIG. 1 according to one embodiment.

FIG. 6 shows an auto-step process 600 for integrated circuit scan test system 100 of FIG. 1 according to one embodiment. Although in the described embodiments the elements of process 600 are presented in one arrangement, other embodiments may feature other arrangements. For example, in various embodiments, some or all of the steps of process 600 can be executed in a different order, concurrently, and the like. For clarity, process 600 does not include the loading of test vectors into scan chain 124. However, the loading of test vectors into scan chain 124 can easily be incorporated into process 600.

Referring to FIG. 6, at 602 integrated circuit scan test system 100 is reset. At 604 integrated circuit scan test system 100 is initialized. In particular, clock control module 114 is programmed to assert clock gate signal ClkGate upon the occurrence of one or more predetermined conditions, for example, when one or more monitored signals assume predetermined values. In addition, auto-step module 402 loads an initial value for offset integer N into cycle register 404. At 606, function module 106 begins nominal operations at full clock speed. Nominal operations continue until upon the occurrence of one or more predetermined conditions at 608. Then at 610, clock control module counts N cycles of system clock signal Sysclk before stopping function clock Fclk at 612. In particular, when the monitored signals assume predetermined values, trigger module 406 asserts the Trigger signal, which causes clock module 408 to begin counting cycles of system clock signal Sysclk. When the count reaches N, comparator 410 stops function clock signal Fclk by asserting clock gate signal ClkGate. In response, clock gate module 112 ceases to pass system clock signal Sysclk, thereby stopping function clock signal Fclk.

At 614 test data module 120 captures the test data from scan chain 124 of function module 106 for analysis. At 616, auto-step module 402 increments the value of N in cycle register 404 and asserts the Reset signal, which resets function module 106 and the count held by clock module 408. In some embodiments, the value of N is incremented by 1 each time. In other embodiments, other values can be used. The scan testing the continues with the resumption of nominal operations at 606. This process can be repeated as many times as desired to obtain a time series of test data of any length for analysis.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. An apparatus comprising:
   a control module configured to (i) receive a first clock signal, and (ii) generate a gate signal based on the first clock signal;
   a gate module configured to (i) receive the first clock signal, and (ii) cease outputting the first clock signal based on the gate signal;
   a function module comprising a plurality of storage elements, wherein the plurality of storage elements are configured to operate according to the first clock signal or a second clock signal;
   a mode module configured to generate a mode signal subsequent to the control module generating the gate signal, wherein the plurality of storage elements are configured to form a scan chain in response to the mode signal; and
   a first multiplexer configured to (i) receive the first clock signal, the second clock signal and the mode signal, and (ii) based on the mode signal, output the first clock signal or the second clock signal to the function module,
   wherein the control module comprises
      a register configured to store a predetermined number of cycles,
      a trigger module configured to generate a trigger signal,
      a counter configured to count cycles of the first clock signal in response to the trigger signal, and
      a comparator configured to (i) compare the predetermined number of cycles to a number of the cycles counted by the counter, and (ii) provide the gate signal to the gate module in response to the counter counting the predetermined number of cycles of the first clock signal.

2. The apparatus of claim 1, wherein the control module is configured to:
   monitor a plurality of signals; and
   provide the gate signal to the gate module in response to the plurality of signals matching respective predetermined values.

3. The apparatus of claim 2, further comprising a scan module configured to provide the second clock signal to the multiplexer,
   wherein the scan chain is configured to (i) operate based on the first clock signal while the gate module is not generating the gate signal, and (ii) shift out first data stored in the scan chain while the gate module is generating the gate signal.

4. The apparatus of claim 3, further comprising a clock module configured to generate the first clock signal.

5. The apparatus of claim 3, wherein the trigger module is configured to provide the trigger signal to the counter in response to the plurality of signals matching respectively the predetermined values.

6. The apparatus of claim 5, further comprising a step module configured to increment the predetermined number of cycles in the register subsequent to the first data stored in the scan chain being shifted out of the scan chain.

7. The apparatus of claim 6, wherein the gate module is configured to provide the first clock signal to the function module subsequent to the step module incrementing the predetermined number of cycles and until the control module provides the gate signal to the gate module.

8. The apparatus of claim 1, further comprising a data module to capture first data output from the scan chain,
   wherein the scan chain is configured to (i) operate based on the first clock signal while the gate module is not generating the gate signal, and (ii) shift out the first data stored in the scan chain while the gate module is generating the gate signal.

9. A method for testing an integrated circuit, the method comprising:
   generating a first clock signal;
   based on the first clock signal, generating a gate signal via a control module;
   receiving the first clock signal at a gate module;

based on the gate signal, ceasing to output the first clock signal from the gate module;
operating a plurality of storage elements in a function module and according to the first clock signal or a second clock signal, wherein the integrated circuit comprises the function module;
generating a mode signal subsequent to the generating of the gate signal;
in response to the mode signal, forming a scan chain with the plurality of storage elements;
receiving the first clock signal, the second clock signal, and the mode signal at a multiplexer;
based on the mode signal, outputting one of the first clock signal and the second clock signal to the function module;
generating a trigger signal;
counting, via a counter, cycles of the first clock signal in response to the trigger signal;
comparing a predetermined number of cycles to a number of cycles counted by the counter;
providing the gate signal to the gate module in response to the counter counting the predetermined number of cycles of the first clock signal;
shifting data out of the scan chain; and
capturing the data shifted out of the scan chain.

10. The method of claim 9, further comprising:
monitoring a plurality of signals; and
providing the gate signal to the gate module in response to the plurality of signals matching respective predetermined values.

11. The method of claim 10, further comprising providing the trigger signal to the counter in response to the one or more monitored signals.

12. The method of claim 11, further comprising incrementing the predetermined number subsequent to capturing the data stored in the scan chain.

13. The method of claim 12, further comprising:
subsequent to the incrementing of the predetermined number, providing the first clock signal to the function module until the gate signal is generated; and
providing the mode signal subsequent to providing the gate signal.

14. A non-transitory computer readable medium configured to store instructions executable by a computer, wherein the instructions are for testing an integrated circuit, and wherein the instructions comprise:
generating a first clock signal;
based on the first clock signal, generating a gate signal via a control module;
receiving the first clock signal at a gate module;
based on the gate signal, ceasing to output the first clock signal from the gate module;
operating a plurality of storage elements in a function module and according to the first clock signal or a second clock signal, wherein the integrated circuit comprises the function module;
generating a mode signal subsequent to the generating of the gate signal;
in response to the mode signal, forming a scan chain with the plurality of storage elements;
receiving the first clock signal, the second clock signal, and the mode signal at a multiplexer;
based on the mode signal, outputting one of the first clock signal and the second clock signal to the function module;
generating a trigger signal;
counting via a counter cycles of the first clock signal in response to the trigger signal;
comparing a predetermined number of cycles to a number of cycles counted by the counter;
providing the gate signal to the gate module in response to the counter counting the predetermined number of cycles of the first clock signal;
shifting data out of the scan chain; and
capturing the data shifted out of the scan chain.

15. The non-transitory computer readable medium of claim 14, wherein the instructions further comprise:
monitoring a plurality of signals; and
providing the gate signal to the gate module in response to the plurality of signals matching respective predetermined values.

16. The non-transitory computer readable medium of claim 15, wherein the instructions further comprise providing the trigger signal to the counter in response to the one or more monitored signals.

17. The apparatus of claim 6, wherein:
the first data is shifted out of the scan chain for a first test of the scan chain; and
subsequent to the first data being shifted out of the scan chain,
the step module increments the predetermined number to (i) provide a second predetermined number, and (ii) begin a second test of the scan chain,
the counter is configured to reset,
the function module is configured to (i) reset, and (ii) operate the plurality of storage elements again based on the first clock signal, and
the comparator is configured to (i) compare a value of the counter to the second predetermined number, and (ii) provide the gate signal in response to the counter being greater than or equal to the second predetermined number to shift second data out of the scan chain as a result of performing the second test, wherein the comparator does not provide the gate signal while the counter is less than the second predetermined number.

18. The apparatus of claim 1, wherein the plurality of storage elements are configured to form:
a first scan chain when the mode signal is in a first state; and
a second scan chain when the mode signal is in a second state.

19. The apparatus of claim 1, wherein the first multiplexer is configured to output the first clock signal to connect the plurality of storage elements to form:
a first scan chain if the mode signal is in a first state; and
a second scan chain if the mode signal is in a second state.

20. The apparatus of claim 1, wherein the function module comprises:
a first storage element configured to store a first input signal based on the first clock signal;
a second storage element configured to, based on the first clock signal, store a second input signal;
a first circuit configured to receive an output of the first storage element;
a second circuit configured to receive an output of the second storage element;
a second multiplexer configured to receive an output of the first circuit;
a third multiplexer configured to, based on the mode signal, output either the output of the second storage element or an output of the second circuit;
a third storage element configured to
store an output of the second multiplexer, and generate a first output signal based on (i) the first clock signal, and (ii) the output of the second multiplexer; and a fourth storage element configured to store an output of the third multiplexer, and generate a second output signal based on (i) the first clock signal, and (ii) the output of the third multiplexer, wherein the second multiplexer is configured to, based on the mode signal, provide as the output of the second multiplexer either the output of the first circuit or the second output signal.

21. The apparatus of claim 20, further comprising a data module configured to generate a third input signal based on the first output signal, wherein the function module comprises:

a fourth multiplexer configured to, based on the mode signal, output either the third input signal or a first data signal to provide the first input signal; and a fifth multiplexer configured to, based on the mode signal, output either the output of the first storage element or a second data signal to provide the second input signal.

22. The apparatus of claim 20, further comprising a scan module configured to generate the second clock signal to shift data through the scan chain, wherein:

the first multiplexer is configured to, based on the mode signal, provide the second clock signal instead of the first clock signal to the first storage element, the second storage element, the third storage element, and the fourth storage element; and the scan chain comprises (i) the first storage element and the second storage element, or (ii) the first storage element, the third storage element, and the fourth storage element.

23. The apparatus of claim 1, wherein the counter is incremented based on the first clock signal and not the second clock signal.

24. The method of claim 12, further comprising:

subsequent to a first test of the scan chain, incrementing the predetermined number of cycles and resetting the counter, wherein the data is shifted out of the scan chain during the first test of the scan chain; and during a second test of the scan chain, (i) comparing the incremented predetermined number of cycles to the cycles counted by the counter, and (ii) providing the gate signal to the gate module in response to the counter counting the incremented predetermined number of cycles of the first clock signal.

* * * * *